US009778331B2

(12) United States Patent
Hunkeler et al.

(10) Patent No.: US 9,778,331 B2
(45) Date of Patent: Oct. 3, 2017

(54) NMR-MAS PROBE HEAD WITH INTEGRATED TRANSPORT CONDUIT FOR AN MAS ROTOR

(71) Applicant: BRUKER BIOSPIN GMBH, Rheinstetten (DE)

(72) Inventors: Andreas Hunkeler, Zurich (CH); Benno Knott, Karlsruhe (DE); David Osen, Ettlingen (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 525 days.

(21) Appl. No.: 14/156,473

(22) Filed: Jan. 16, 2014

(65) Prior Publication Data
US 2014/0125340 A1    May 8, 2014

(30) Foreign Application Priority Data

Jan. 24, 2013  (DE) .................. 10 2013 201 110

(51) Int. Cl.
G01R 33/30    (2006.01)
G01R 33/31    (2006.01)
G01R 33/34    (2006.01)

(52) U.S. Cl.
CPC .......... *G01R 33/307* (2013.01); *G01R 33/31* (2013.01); *G01R 33/34092* (2013.01)

(58) Field of Classification Search
CPC  G01R 33/307; G01R 33/31; G01R 33/34015; G01R 33/34092
See application file for complete search history.

(56) References Cited

U.S. PATENT DOCUMENTS

| | | | |
|---|---|---|---|
| 4,859,948 A | 8/1989 | Kuster | |
| 5,146,166 A * | 9/1992 | Bartuska | G01R 33/307 324/321 |
| 5,150,054 A | 9/1992 | Dupree | |
| 6,803,764 B2 | 10/2004 | Hioka | |
| 8,217,655 B2 * | 7/2012 | De Vries | G01R 33/307 324/321 |
| 2008/0088312 A1 | 4/2008 | Spraul | |

(Continued)

FOREIGN PATENT DOCUMENTS

JP    2000-203717    7/2000

OTHER PUBLICATIONS

Shevgoor, Sid et al., "Development of a CryoMAS HR-MAS-MAG NMR Probe for High-field WB Magnets", Doty Scientific, Columbia, SC.

*Primary Examiner* — David M Gray
*Assistant Examiner* — Laura Roth
(74) *Attorney, Agent, or Firm* — Paul Vincent (57) ABSTRACT

An NMR MAS probe head (1) has an MAS stator (7) with a base bearing (8) and a front bearing (75) for receiving a substance to be measured at a measurement position within an MAS rotor. The front bearing has an opening for inserting the MAS rotor into the space between the base bearing and the front bearing. The opening can be closed by a closing device that, in a loading state, opens and, in a measuring state, closes the opening by means of a movement that is transverse with respect to an axis (a) through the centers of the base bearing and the opening of the front bearing of the MAS stator. This enables automated loading and unloading of the MAS rotor in the space between the base bearing and the front bearing inside the MAS stator in a simple way.

12 Claims, 11 Drawing Sheets

(56) References Cited

U.S. PATENT DOCUMENTS

2010/0109666 A1   5/2010  Armbruster
2014/0005522 A1*  1/2014  Zurovcik ........... A61B 10/0233
                                                      600/411
2014/0099730 A1*  4/2014  Hu ...................... G01R 33/307
                                                      436/173

* cited by examiner

Prior Art

NMR-MAS PROBE HEAD WITH INTEGRATED TRANSPORT CONDUIT FOR AN MAS ROTOR

This application claims Paris convention priority from DE 10 2013 201 110.5 filed Jan. 24, 2013, the entire disclosure of which is hereby incorporated by reference.

BACKGROUND OF THE INVENTION

The invention concerns a nuclear magnetic resonance (=NMR) magic-angle spinning (=MAS) probe head with an MAS stator disposed in a tube, wherein the MAS stator comprises a base bearing and a front bearing for receiving a substance to be measured at a measurement position in an elongated, substantially circularly cylindrical MAS rotor, wherein the front bearing has an opening (which can be closed by means of a closing device) for inserting an MAS rotor into the space between the base bearing and the front bearing.

A stator with a screwable closing device for installation in an NMR MAS probe head of the type stated in the introduction has been commercially available for some time, for example, from Prof. Ago Samoson, University of Technology, Tallinn, Estonia.

Nuclear magnetic resonance (=NMR) spectroscopy is a process for instrumental analysis with which, in particular, the chemical composition of measurement samples can be determined. Radio-frequency (RF) pulses are irradiated into the measurement sample, which is located in a strong, static magnetic field, and the electromagnetic reaction of the sample is measured.

To reduce spectral line broadening due to anisotropic interactions, it is known that an NMR sample can, during spectroscopic measurement, be tilted and rotated at the so-called "magic angle" of approx. 54.74° with respect to the static magnetic field ("MAS"=Magic Angle Spinning). For this purpose, the sample is filled into an MAS rotor. MAS rotors are cylindrical tubes open at one end, which are closed with a cap, wherein the cap is provided with vane elements ("impellers"). The MAS rotor is disposed in an MAS stator and the MAS rotor is made to rotate by gas pressure by means of the vane elements. The MAS rotor and MAS stator are collectively termed an MAS turbine.

During the NMR measurement, the MAS turbine is disposed in an NMR MAS probe head. The probe head has a cylindrical shield tube (also called "tube" for short) and usually a base box. The tube contains radio-frequency (=RF) electronic components, in particular RF resonator coils, and the MAS turbine, wherein the MAS turbine is disposed in the region of the tube end facing away from the base box. The probe head is typically inserted with its shield tube into the vertical room temperature bore of a superconducting magnet from below, then positioned, and held with hooks, supports, screws, or the like. The MAS turbine is then in the precise magnetic center of the magnet.

To replace an NMR sample or an MAS rotor filled with a substance to be measured on simple probe heads, it is necessary to remove the probe head from the magnet, i.e. to extract the probe head from the room temperature bore. For this purpose, the user kneels under the magnet, releases the supports and cable connections, and catches the probe head when it slides out of the magnet. Due to the eddy currents induced in the metal parts of the probe head, in particular in the shield tube, and the intrinsic weight of the probe head, removing the probe head, or indeed re-inserting it into the magnet, can require considerable exertion. To ensure safety, manufacturers of probe heads prescribe that the probe head should be removed by two people together. The rotor can then be replaced manually on the removed probe head. Re-shimming is usually necessary after the rotor has been replaced and the probe head therefore repositioned in the magnet, making the overall procedure very time-consuming.

DE 38 18 039 A1 discloses a rotatable sample magazine provided on the probe head in the immediate vicinity of the MAS stator such that the sample in the MAS stator can be replaced multiple times by the action of gas pressure without removing the probe head or the sample magazine from the interior of the magnet.

The technical poster of Shevgoor et al., discloses use of a lift system for MAS rotors. At the tube end of a probe head facing away from the base box, a transport tube is connected that extends through the room temperature bore of a magnet upward out of the magnet. By means of gas pressure, an MAS rotor can be transported through the transport tube into the MAS stator of the probe head mounted in the magnet, and an MAS rotor can also be transported out of the MAS stator upward out of the probe head.

Because the transport tube is routed through the room temperature bore, both the room temperature bore as well as regions above the magnet contain obstructive structures, which increases the complexity of the apparatus. Initial installation of the probe head is also rendered more difficult by the transport tube. The transport tube also has to be routed through the wall of the shield tube to the MAS stator, which makes RF shielding of the sample during NMR measurement more difficult.

In many cases, measurement of the sample under defined, extreme temperature conditions, in particular at cryogenic temperatures (−196° C. or lower) is desired. The interior of the shield tube is temperature controlled or cooled. In this case, the passage of the transport tube through the tube at the end farthest from the base box constitutes a thermal bridge that makes it more difficult to comply with defined, extreme temperature conditions.

DE 10 2008 054 152 B3 proposes a probe head with a base box and a tube attached to and protruding from the base box which permits a fast change between different MAS rotors while facilitating RF shielding and compliance with defined, extreme temperature conditions, wherein the MAS stator for receiving an MAS rotor is disposed inside the tube in the region of the tube end facing away from the base box. A transport tube is provided for pneumatically conveying an MAS rotor inside the transport tube, which extends in the interior of the tube from the base box to the MAS stator. However, in this conventional configuration, the front bearing does not have an opening, like on a generic probe head of the type defined in the introduction, which can be closed by means of a closing device for introducing an MAS rotor into the space between the base bearing and front bearing, so that changing rotors in the closed probe head is not possible. In particular, on MAS rotors with diameters<1.3 mm, closure at both ends is necessary to stabilize the rotation.

The generic probe head having the characteristics defined in the introduction and the stator offered by Prof. Ago Samoson with a screwable closing device cannot, for their part, be used with a rotor without having to remove the probe head from the magnet—with some effort.

This invention, on the other hand, has the object of providing an NMR MAS probe head of the type defined in the introduction with stabilized rotation with which a rotor change is possible without opening the probe head, and in which the probe head can remain in place in the magnet system.

SUMMARY OF THE INVENTION

This object is achieved with an NMR MAS probe head of the type stated in the introduction, characterized in that a transport tube for conveying an MAS rotor inside the transport tube is provided, wherein this transport tube extends in the interior of the tube from the base box to the MAS stator, and that the closing device can, by means of a movement that is transverse with respect to an axis through the centers of the base bearing and the opening of the front bearing of the MAS stator, clear the opening in a loading state and close it for a measuring state.

This makes automated changing of the rotor possible without taking the probe head out of the magnet.

Because the transport tube extends in the interior of the tube (shield tube), it is possible to constitute the tube to be closed in the region around the MAS turbine, that is, in the region of the free tube end (facing way from the base box). It is not necessary for the transport tube to pass through the wall of the tube.

The shielding effect of the usually metallic conductive, but non-ferromagnetic tube can then be completely preserved. Moreover, it is not necessary to tolerate a thermal bridge caused by the passage of a transport tube through the tube in the region of the end farthest from the base box.

Only the tube of the probe head projects into the room temperature bore; the end of the room temperature bore of the NMR magnet that is opposite the probe head does not need to be covered. This simplifies the structure of an NMR apparatus, in particular of an NMR spectrometer. The entire sample change (rotor change) can be performed from one end of the NMR magnet only, namely from the end with the NMR probe head (typically the underside of the NMR magnet) via a pneumatic lift system.

The sample change can be automated; preferably, a semi-automatic sample change (changed triggered manually but performed automatically after manual triggering) is set up.

In a highly preferred embodiment of the inventive probe head, the closing device has a pneumatic actuator that can at least effect the movement to clear the opening in the loading state, thus enabling automated loading.

Embodiments of the invention are also preferred in which a pneumatic sample changing system for feeding and removing an MAS rotor to the MAS stator is provided, which also contributes to automation of the measurement preparations.

Advantageous variants of this embodiment are characterized in that the transport tube has a Y-junction device with a blind hole section for intermediate storage of an MAS rotor.

The main functions of the Y-junction device (reversal device) are, to avoid tight curves in the transport tube while loading and unloading the MAS rotor, and to enable favorable orientations of the MAS rotors, in particular, with upwardly oriented closing caps during transport and support on the closed base end of the sample tube of the rotor (farthest from the cap) in the MAS stator. By avoiding tight curves, the space requirement for the transport tube can be greatly reduced. With the Y-junction device, the transport direction of the MAS rotor after intermediate storage in the blind hole section can be reversed by approximately 180° in a simple manner without having to negotiate a 180° curve. During the reversal maneuver, the orientation (i.e. the cap-to-base end sequence) of the rotor changes relative to the transport direction. The reversal device permits, in particular, insertion of the rotor, the latter's base level being inserted first, into the stator, wherein the insertion opening of the stator faces away from the base box end of the sample tube. The transport tube is routed from the base box past the stator to the blind hole section. A tube section leading to the MAS stator (or also directly to the MAS stator) and the tube section leading past the stator to the base box are both accessible from the blind hole section (typically with no or only little curvature of the transport tube). The blind hole section can, if necessary, also provide a resilient buffer volume to avoid hard impact of the rotor on the base of the blind hole section and to facilitate immediate removal of the rotor from the blink hole section.

A variant of these embodiments is advantageous in which the blind hole section is constituted in a rocker which can be swiveled about a pivot. In this way, curvatures in the transport tube, and in particular in a tube section leading to the MAS stator are reduced or completely avoided. The swiveling of the blind hole section can be controlled by gas pressure; typically, there are two end positions of the rotatable blind hole section, one in which the MAS stator is accessible and one in which the tube section leading to the base box is accessible.

In an alternative embodiment, the Y-junction device contains a branch of the transport tube. This is an especially simple implementation of the Y-junction device. Note that in the branch region, a widened cross section (as compared with the outer dimensions of the MAS rotor or the remaining transport tube) of the transport tube is provided. In an advantageous variant, one or more nozzles are provided in the region of the branch for pneumatic redirection of an MAS rotor. In this way, the transport direction of the rotor can be especially well controlled. Alternatively, it is also possible to only direct the rotor using transport gas flows at the branching point inside the transport tube.

A variant of the above embodiments is also preferred in which the pneumatic actuator of the closing device can be operated with the same compressed air supply as the pneumatic sample change system. This makes the system more compact and lower-cost.

In an especially preferred embodiment, the probe head is constituted in the region of the tube as a Dewar vessel. The tube is double-walled, with a vacuum between the walls; this facilitates temperature-control and cooling of the sample in the probe head for NMR measurement. Because of the closed design there are no unwanted thermal bridges.

An embodiment is also preferred in which the MAS stator is rotatably supported for setting the MAS angle. The rotation of the stator in the probe head can further facilitate insertion and removal of the MAS rotor in a confined space. Tight curves are thereby avoided. The rotation of the stator can, for insertion and removal, set an angle of the stator bearing axis relative to the longitudinal direction of the tube (which regularly corresponds at least in a good approximation to the direction of the static magnetic field in the NMR magnet) that is smaller than the magic angle.

In one class of advantageous embodiments of the inventive probe head, the closing device comprises a gate valve that closes the opening toward the transport tube in the measuring state of the MAS rotor and opens it in the loading state via a movement that is transverse with respect to the longitudinal axis. This has the advantage that the device for opening and closing can be implemented simply.

An alternative class of embodiments of the invention is characterized in that the closing device comprises a gate valve that closes the opening toward the transport tube in the measuring state of the MAS rotor and opens it in the loading state by a movement on a curved trajectory having one component that is transverse and one component that is parallel to the longitudinal axis. This enables the closure to engage in the opening of the front bearing of the MAS stator.

In advantageous variants of this class of embodiments, the gate valve is guided on the curved trajectory by means of a guide contour on one or more guide pins, permitting simple implementation of the device for opening and closing.

Both of the aforementioned classes of embodiments of the inventive probe head can be further developed so that the gate valve contains a pressure element loaded by spring force, which causes the opening to close in the measuring state of the MAS rotor. In this way, closure is possible in the operating state in the closing position without external force.

An especially preferred variant of these embodiments is characterized in that the pressure element is loaded by a compression spring made of non-magnetic material, preferably CuBe or spring bronze. In this way, the NMR signal is not adversely influenced by the materials of the compression spring.

Further advantages result from the description and the drawing. Moreover, the features stated above and further below can be used inventively singly or together in any combination. The embodiments shown and described are not intended to be an exhaustive list, rather are examples to explain the invention.

The invention is shown in the drawing and is explained in more detail using the example of the embodiments. The figures show.

BRIEF DESCRIPTION OF THE DRAWING

DESCRIPTION OF THE PREFERRED EMBODIMENT

The invention concerns a new system for replacing MAS rotors in an MAS NMR probe head, wherein the probe head can remain mounted in the magnet of an NMR spectrometer.

Figure 1:
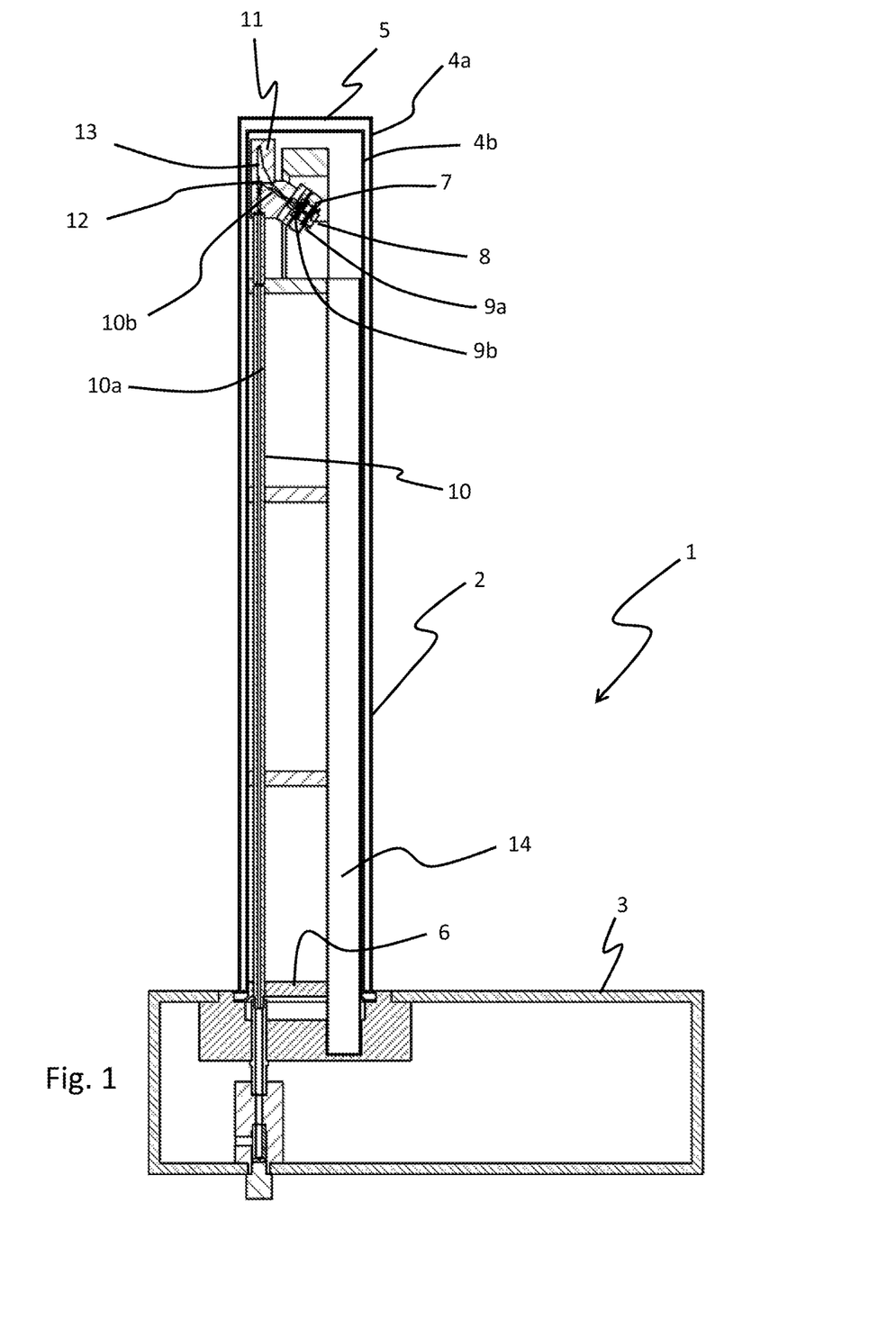
FIG. 1 a schematic cross-sectional view of an inventive NMR MAS probe head, with a Y-junction device with a branch.

FIG. 1 shows an inventive NMR MAS probe head 1 in vertical section. The probe head 1 essentially comprises a tube 2, which is to be inserted into the room temperature bore for an NMR measurement, and a base box 3. The tube 2 is attached to the base box 3 and projects perpendicularly from the base box 3 (in this case). The base box 3 remains outside the room temperature bore of the magnet. The probe head 1 as a whole is typically held or attached via the base box 3, in particular on the magnet or a substructure of the magnet.

In this embodiment, the tube 2 has a double wall (with an outer wall 4a and an inner wall 4b), between which a vacuum is provided, so that the tube 2 is also constituted as a Dewar vessel for thermal insulation from the (usually room temperature) environment. Any necessary temperature-control tubes, which are not shown in any greater detail, extend in the tube 2 and in which (in this case) a coolant such as liquid nitrogen circulates to cool the interior of the tube 2, including the sample to be measured in an MAS rotor and NMR measuring electronics, in particular, RF resonators in the region surrounding the MAS rotor. Alternatively (or additionally), the transport gas flow in the transport tube 10 and/or other functional gas flows (see below) can also be cooled, also ensuring good cooling in the interior of the tube 2 (if tube 2 is well insulated).

As least one wall 4a, 4b of the tube 2 is made of electrically highly conductive, but non-ferromagnetic metal (for example, copper). The metallic tube wall effects shielding of the tube interior from external alternating electromagnetic fields; for that reason, the tube 2 is also termed a shield tube.

The tube 2 is closed at its free end 5 (at the top in FIG. 1) facing away from the base box 3; in particular, it contains no feed-throughs for gas or transport tubes. Accesses into the tube interior, for example, for electrical, gas, and transport tubes are exclusively provided in the region of the end 6 of the tube 2 that is nearer the base box.

The tube 2 contains an MAS stator 7 in the region of its free end 5. The stator 7 can hold an MAS rotor (not depicted in FIG. 1) at the magic angle (relative to the longitudinal direction of the tube 2, which is oriented parallel to the static magnetic field in measuring operation) and act as a bearing for rotation about the longitudinal axis of the rotor. The front end of the stator 7 has a base bearing 8, on which the rotor can rest in the stator 7 (supported by gravity). The base bearing 8 has two nozzles (not shown in detail) which provide a bearing gas flow and an ejecting gas flow. The stator 7 also has a first lower radial bearing 9a near to the base bearing 8 and a second, opposite upper radial bearing 9b, in which an opening for routing through the rotor is formed. The base bearing 8 and the first radial bearing 9a face the base box 3, and the second radial bearing 9b face away from the base box 3. The magnetic center of the magnet configuration is located in the center between the first and the second radial bearing 9a, 9b during an NMR measurement. The stator 7 has gas nozzles (not shown in greater detail) that blow onto an inserted rotor and thus make it rotate.

A transport tube 10 for MAS rotors also extends in the interior of the tube 2. A first section 10a of the transport tube 10 leads from the end 6 of the tube 2 that is nearer the base box past the stator 7 to a Y-junction device 11. A second section 10b of the transport tube 10 leads from the Y-junction device 11 to the stator 7. The Y-junction device 11 comprises a blind hole section 13 and a branch 12 of the transport tube 10 (see also FIG. 2). The transport tube 10 is generally constituted by flexible tubes and/or rigid tubes and, in addition to straight sections, can also have curved sections (curves), taking into account the size of the MAS rotors and the play of the rotors in the transport tube 10. The rotors are pneumatically conveyed in the transport tube 10 by gas pressure and/or gravity.

The interior of the tube 2 also has a robust frame 14 on which the stator 7 and various electronic components (not shown separately) are disposed for an NMR measurement on a measurement sample disposed in the stator. The first section 10a of the transport tube 10 is constituted in this case by a rigid tube, providing the frame 14 with better stability. Some electronic components are attached directly to section 10a (not shown separately).

Figure 2:
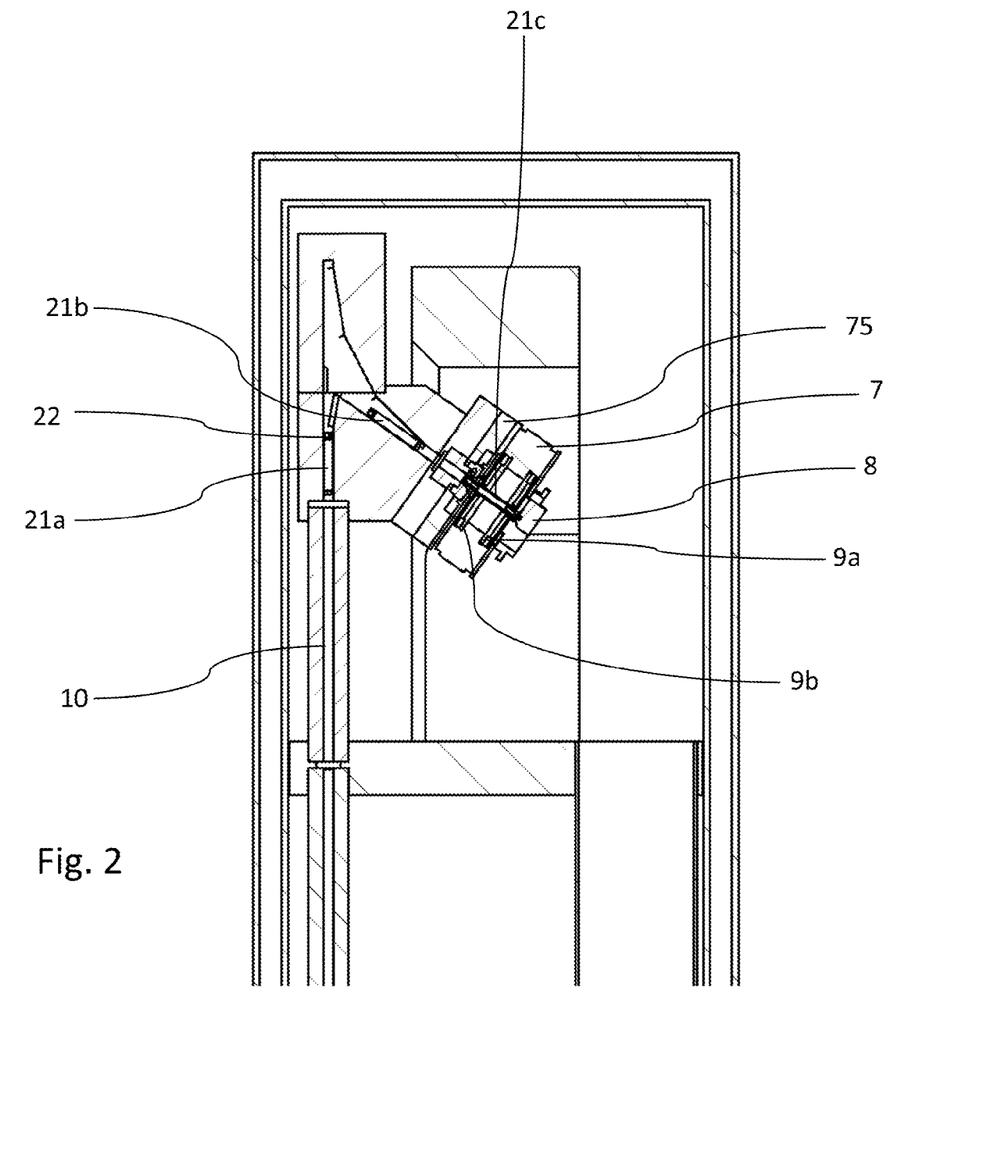
FIG. 2 an enlarged view of the free end of the tube of the probe head of FIG. 1.

FIG. 2 describes the insertion of a MAS rotor 21a, 21b, 21c into the MAS stator 7 of the probe head of FIG. 1 in detail. The representations 21a, 21b, 21c of the rotor show various stages during insertion.

A rotor 21a is initially conveyed by a gas flow upward through the first section 10a of the transport tube toward the Y-junction device 11. The cap 22 of the rotor 21a points upward at this stage. This cap 22 has vane elements (impellers, not shown in FIG. 2).

Rotor 21a is pushed from below upward into the blind hole section 13 by the impinging gas flow. The gas flow then flows from section 10a through the branch 12 into the second section 10b of the transport tube to the stator 7. This gas flow then pulls the rotor 21b toward the second section 10b, i.e. the rotor 21b swivels with its lower base end to the right and falls further. Finally, the rotor 21c is pressed to the right and downward by the gas flow toward the MAS stator 7 into the second section 10b and into the stator 7. During this maneuver, the transport direction undergoes a reversal (reversing maneuver).

A reverse gas flow is applied in order to eject a rotor 21c from the stator 7. This initially presses the rotor 21c from the stator 7 through the second section 10b into the blind hole section 13. A gas flow is then provided from the second section 10b of the transport tube through the branch 12 into the first section 10a of the transport tube. This pulls the rotor 21b in the direction of the first section 10a and finally into the latter, so that the rotor 21a is conveyed back through the first section 10a of the transport tube to the base box. Here too, the transport direction undergoes a reversal (reversing maneuver).

Due to the Y-junction device 11, which, seen from the base box is located beyond (behind) the MAS stator 7, a 180° curve in the transport tube can be replaced by the reversing maneuver, and at the same time, access to the MAS stator 7 from the side facing away from the base box can be provided through the second radial bearing 9b (in FIG. 2 from above). Without the Y-junction device 11, the rotor would have to be routed around a tight curve of at least 180°−54.7°=125.3° to be conveyed from the vertical first section 10a of the transport tube into the stator 7, tilted at the magic angle, and back again. Because the radius of curvature of a transport tube is limited by the dimensions of the rotor, such a tight curve would require a large amount of space in the tube of the probe head. By avoiding the tight curve, the tube can have a small interior diameter ID so that an inventive probe head can be inserted into even narrow room temperature bores of magnet configurations. In the embodiment shown in FIG. 2, only a slight curve of 54.7° is provided in the region of the second section 10b of the transport tube. According to the invention, the outer diameter of the tube can easily be limited to 40 mm or 73 mm for usual room temperature bores.

Note that during the entire conveying in and out action and during the NMR measurement, the cap-end of the rotor 21a, 21b, 21c remains essentially oriented upward so that there is no danger that sample material will spill or leak out if the cap is not tight.

To support the redirection of a rotor 21b in the region of the branch 12, a nozzle (or also a plurality of nozzles, in particular mutually opposite nozzles) can be provided that can pneumatically deflect the MAS rotor 21b so that the rotor 21b takes the desired path at the branch 12.

Moreover, the MAS stator 7 can be swivelably supported to reduce the curve in the movement of the MAS rotor 21b, 21c when conveying from blind hole section 13 into the MAS stator 7 and vice versa. For conveying, the MAS stator 7 would then be swiveled clockwise according to swivel direction S (in this example, shown for swiveling about the magnetic center); then the second section 10b of the transport tube could be steeper; the probe head could then be implemented even more compactly. For the positions of the stator 7 for measuring the NMR tube at the magic angle and for conveying the rotor, fixed stops are advantageously provided; swiveling can be achieved by gas pressure.

Figures 3A, 3B:
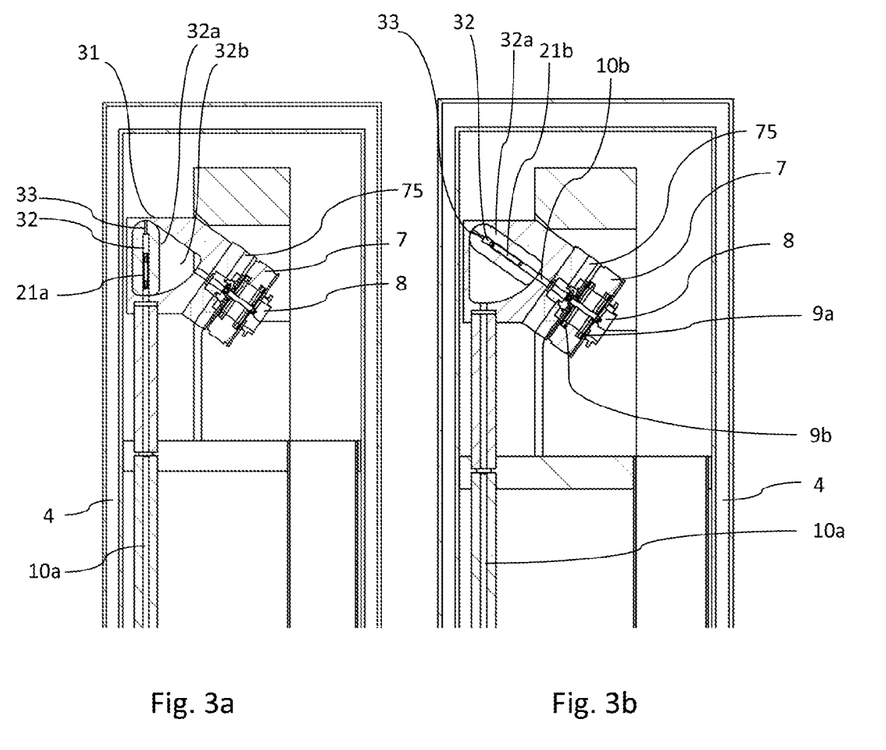
FIG. 3a a schematic view of an inventive probe head in the region of the free end of the tube, with a Y-junction device, comprising a rotatably supported blind hole section (rocker) in a first position.
FIG. 3b the free end of the tube of FIG. 3a, in a second position of the rotatably supported blind hole section.

FIG. 3a shows an alternative embodiment of a Y-junction device 31 in an inventive NMR MAS probe head. Only the differences with respect to the embodiment of FIG. 2 are explained.

The Y-junction device 31 has a rotatably supported blind hole section 32, which is constituted in a rocker 32a; the rocker 32a can be swiveled in a sector region 32b about a pivot (here above). An MAS rotor 21a can be introduced into the blind hole section 32. In the first position of the rocker 32a shown in FIG. 3a, the blind hole section 32 is accessible from the first section 10a of the transport tube, leading to the base box. In particular, a rotor 21a can be conveyed (through the first section 10a) into the rocker 32a by a gas flow from below, or conveyed out by a gas flow from above (through the nozzle 33 at the end of the blind hole section 32) to the end of the transport tube nearer the base box.

If an MAS rotor 21a is completely inserted into the rocker 32a, the latter can be swiveled, in particular into the second position shown in FIG. 3b. In this second position, the blind hole section 32 is accessible for the second section 10b of the transport tube or for the stator 7. If gas is blown into the blind hole section 32 through the nozzle 33, the rotor 21b is conveyed into the stator 7. In the reverse direction, by blowing a gas flow from the base bearing 8, the rotor 21b can be conveyed into the rotatable blind hole section 32. In this way, the Y-junction device 31 will permits a space-saving reversing maneuver.

The rocker 32a can be operated (swiveled) by a pneumatic actuator, not depicted in further detail; the positions shown in FIGS. 3a and 3b each show end positions at a mechanical stop (edges of the sector range 32b).

In the embodiment of the tube of the probe head in FIGS. 3a, 3b, the tube only has a single wall 4.

Figure 4:
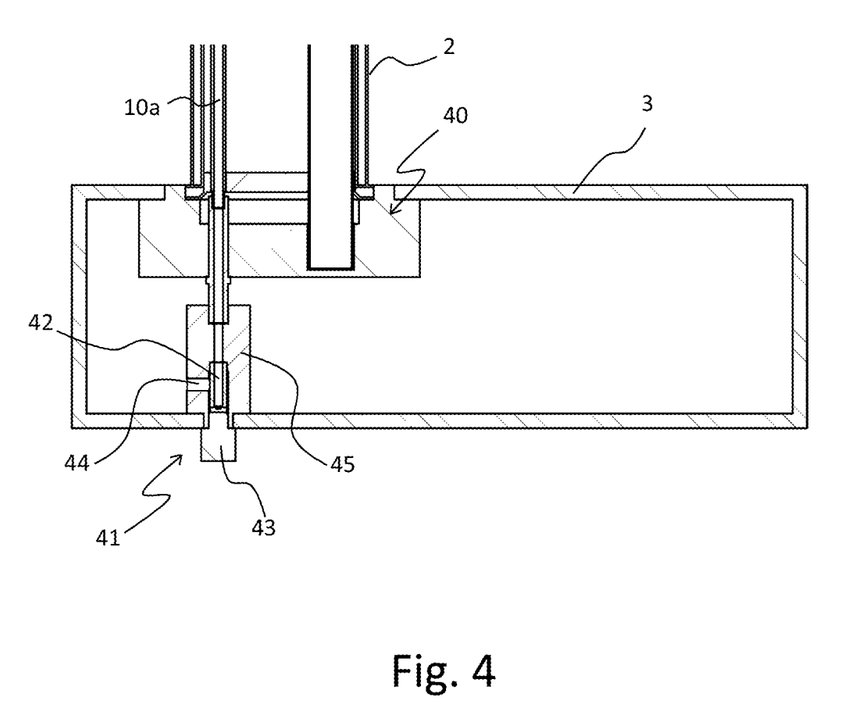
FIG. 4 an enlarged view of the base box region of the probe head of FIG. 1.

FIG. 4 illustrates the base box 3 of the probe head of FIG. 1 in more detail. The base box 3 comprises a support 40 for the tube 2 and electrical connections as well as transport gas and functional gas connections (usually bearing gas, driving gas, VT gas, insert gas, ejecting gas, purging gas and drying gas), not shown in further detail, and any necessary coolant connections. In the embodiment shown, a rotor gas lock 41 is also provide which, in this case, is constituted as a cryo gas lock. The rotor gas lock 41 is in the extension of the transport tube (of its section 10a in this case) and has a loading and unloading station 42.

The loading and unloading station 42 has a lower opening that can be closed with a rotor catcher 43. The rotor catcher 43 can hold an MAS rotor and an MAS rotor can be conveyed out of and into the loading and unloading station 42 manually with it (for example, to change the rotor). The loading and unloading station 42 has an access 44 for insert gas. Upon removal of the rotor catcher 43, the loading and unloading station 42 is automatically purged with outflowing eject gas. The rotor gate 41 has an enclosure 45, which has a thermally insulating effect and shields from room air in a gas-tight manner. The stator of the MAS turbine is (directly and/or indirectly) accessible from the loading and unloading station 42.

The rotor gas lock 41 can comprise an additional stator into which an MAS rotor can be inserted and in which the MAS rotor can be made to rotate by gas flow propulsion (not depicted). The region of the stator of the rotor gas lock 41 can be cooled (preferably with the same coolant or gas flow with which the interior of the tube 2 is also cooled) so that sample material can be cooled in the interior of a rotor while being rotated ("cooling turbine"). This ensures a rotationally symmetrical distribution of the solidified sample material in the rotor. A rotor can be conveyed by gas pressure from the loading and unloading station 42 into the stator of the cooling turbine and, from there, after the rotor has been cooled and stopped, conveyed by gas pressure, (preferably directly) into the stator of the MAS turbine ("insert"). A measured rotor can (preferably directly) be ejected from the stator of the MAS turbine to the loading and unloading station 42 or into the rotor catcher 43 ("eject"). Between the cooling turbine and vertical transport tube (cf. section 10a), the rotor gas lock 41 then has a mechanical Y-junction (not depicted in detail) with three positions: A first position for the route rotor catcher—cooling turbine, a second position for the route cooling turbine—MAS turbine, and a third position for the route MAS turbine—rotor catcher.

The rotor gas lock 41 constituted as a cryogenic gas lock can, as shown in FIG. 4, be integrated into the base box 3 of the probe head, or be flanged onto the base box 3 (or also directly on the tube 2) (in particular, detachable via a mechanical interface), or also be separate from the probe head and, for example, be located at the base below the NMR magnet, in which case a thermally insulating connection element with the probe head should be used. It is also possible to provide only the loading and unloading station 42 separately from the probe head (for example, on a laboratory bench), and to connect these to the rest of the rotor gas lock 41 (which is then disposed on or in the probe head) and, in particular, directly to the stator of a cooling turbine via flexible or rigid gas-pressure-operated transport tubes. To be operated, the rotor gas lock 41 requires a supply unit, which provides or controls gas flow (including coolant flows) and electric switching operations. The supply unit can be integrated into the base box 3; however, the supply unit is preferably separate from the base box 3 and far enough away from the probe head to preclude mutual interference, in particular with RF components in the probe head.

The rotor gas lock 41 and/or the probe head can comprise:
Light barriers for determining the position of rotors;
Temperature sensors for determining the temperature of rotors, in particular in the cooling turbine or the MAS turbine,
Valves for controlling gas flows, in particular transport gas flows.

Figure 5:
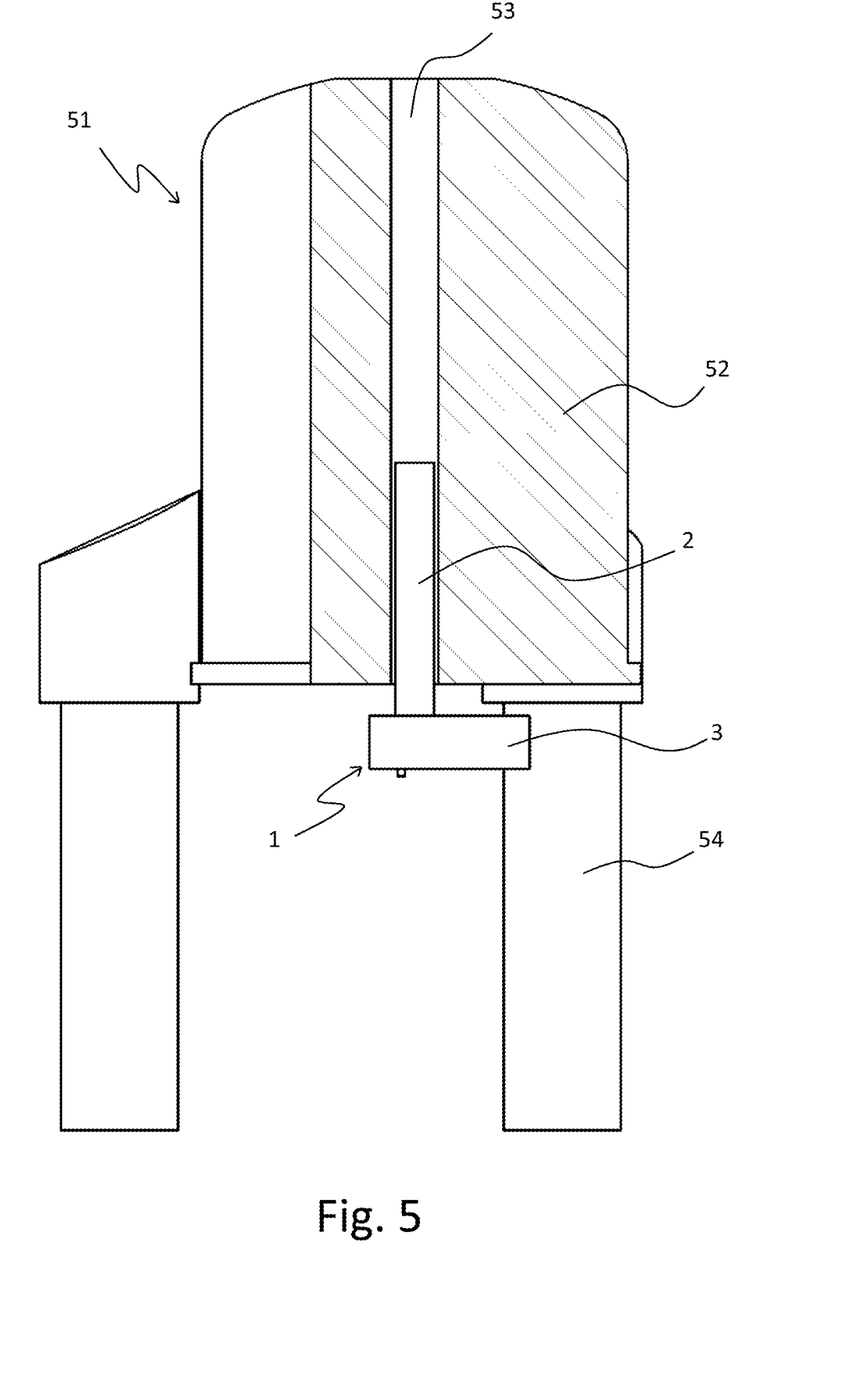
FIG. 5 a schematic cross-sectional view of an inventive NMR apparatus with an inventive probe head introduced from below into the room temperature bore of the magnet.

FIG. 5 shows an inventive modified NMR apparatus 51, comprising a superconducting magnet configuration 52 (here comprising solenoid-shaped, superconducting magnet coils, not depicted in detail) with a vertical room temperature bore 53. The magnet configuration 52 is supported on robust supports 54. An inventive NMR MAS probe head 1 is inserted into the room temperature bore 53 (cf. FIG. 1). The largest part of the tube 2 of the probe head 1 is inside the room temperature bore 53, while the base box 3 of the probe head 1 is disposed outside the room temperature bore 53 below the magnet configuration 52. The largest (upper) part of the room temperature bore 53 remains free, and in particular, the space above the magnet configuration 52 does not need to be covered with a sample changing device. Sample changes (changing rotors) can be performed from below through the probe head 1.

Figure 6:
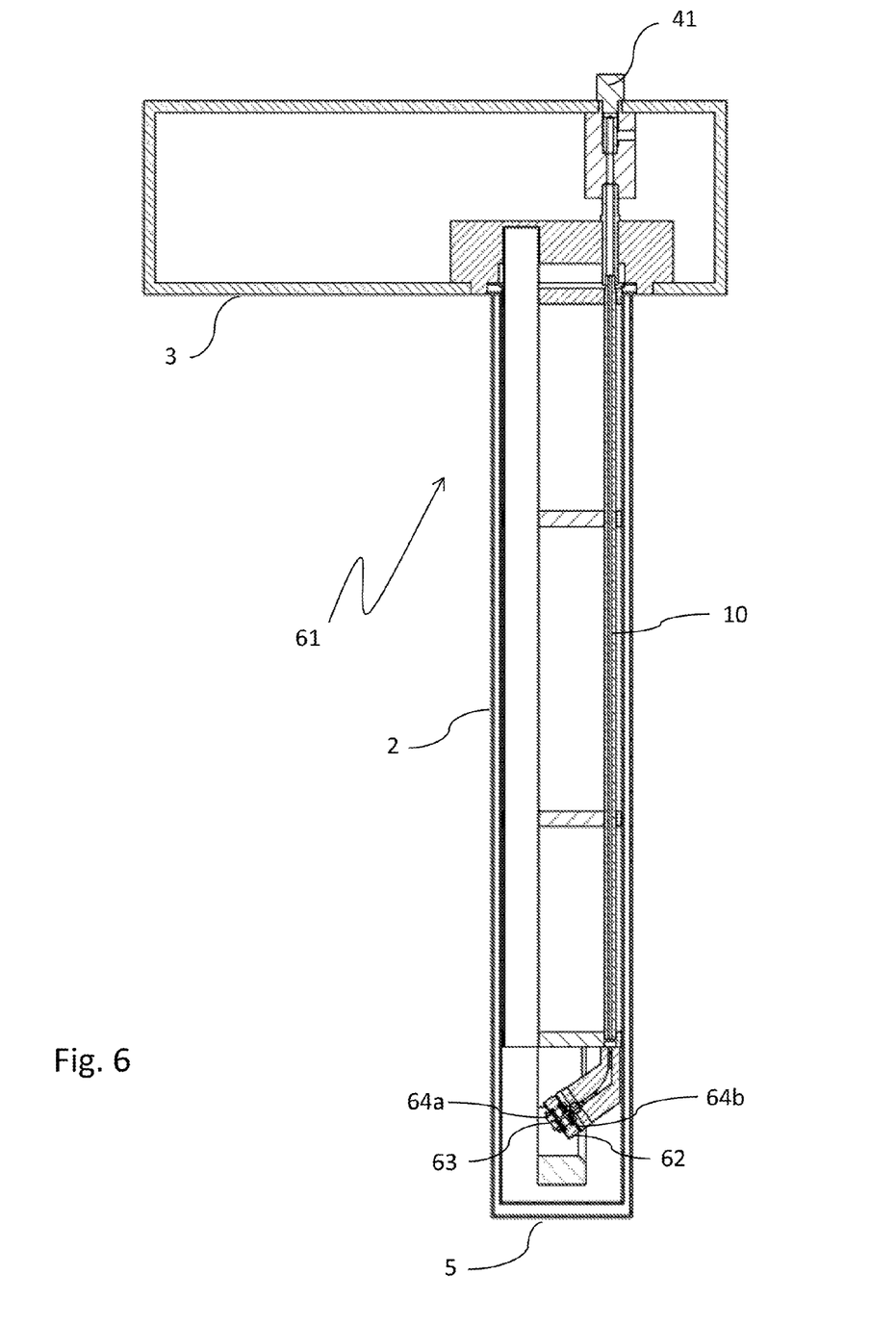
FIG. 6 a schematic cross-sectional view of an inventive NMR MAS probe head without Y-section device, for insertion from above into the room temperature bore of a magnet.

FIG. 6 shows another embodiment of an inventive NMR MAS probe head 61. The probe head 61 is provided for suspended mounting in a magnet configuration, i.e. insertion of the tube 2 of the probe head 61 from above into a vertical room temperature bore of the magnet configuration.

In the interior of the tube 2, a transport tube 10 extends, in which an MAS rotor can be conveyed pneumatically (with gas pressure) from a rotor gas lock 41 in the region of the base box 3 to an MAS stator 62 in the region of the free end 5 of the tube 2 and back again. In this MAS stator 62, the base bearing 63 and the first radial bearing 64a face away from the base box 3, and the second radial bearing 64b, through which an opening for inserting the rotor extends, faces toward the base box 3. The base bearing 63 is therefore disposed in a lowered position so that the rotor can be supported on the base bearing 63 by gravity. Throughout the actions of entry through the gas lock, NMR measurement, and exit through the gas lock, the rotor can remain substantially in the same orientation, namely with its closing cap facing upward. Entry of the rotor through the gas lock is performed in a substantially uniform downward movement (without a reversing maneuver), and also exit through the gas lock is performed in a substantially uniform upward movement (without a reversing maneuver).

Note that the magnetic center is typically somewhat below the geometric center of a magnet configuration and therefore the tube 2 in the embodiment depicted in FIG. 6 may have to be comparatively longer than in the embodiment shown in FIG. 1.

Figure 7A:
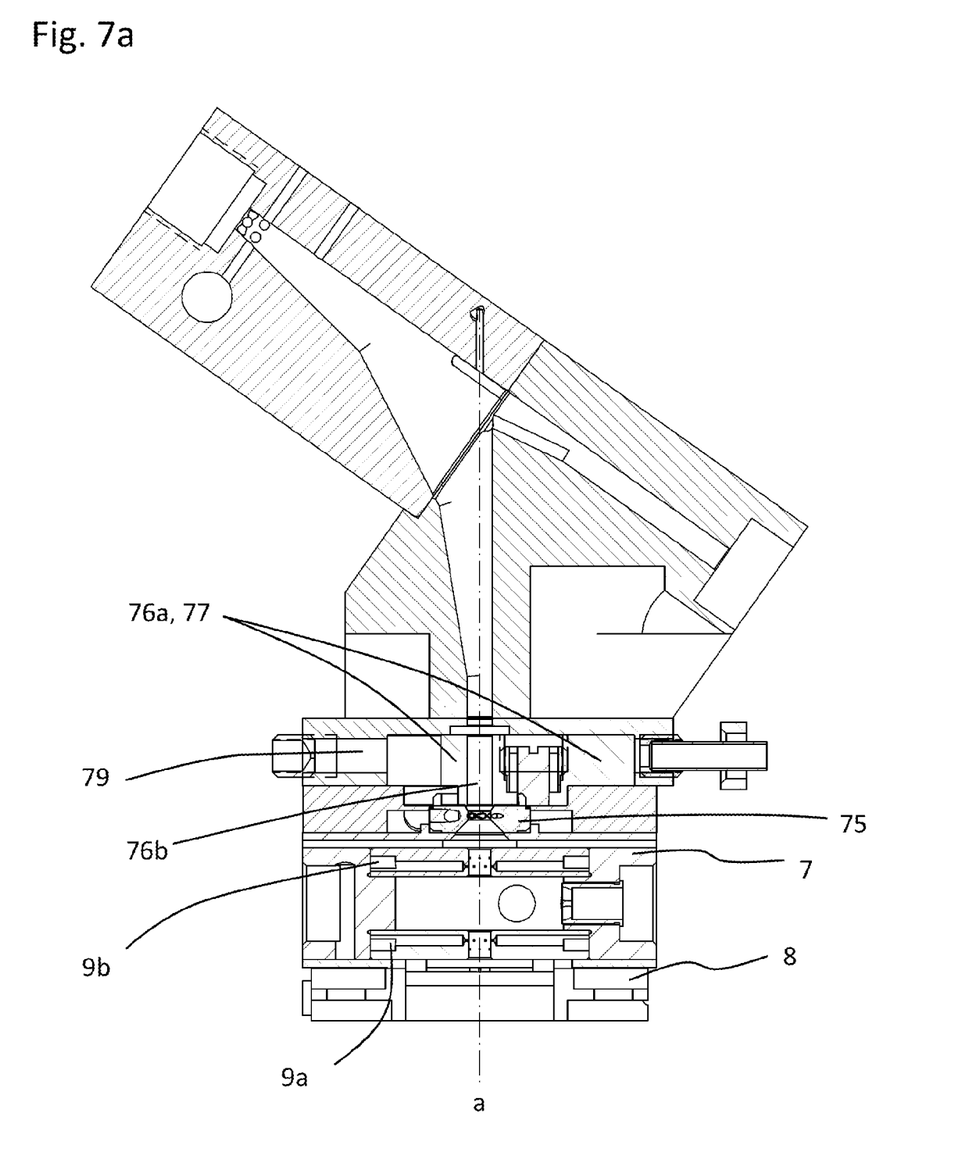
FIG. 7a a detail section, in the ejection position, of an embodiment of the inventive probe head, in which the gate valve closes the opening toward the transport tube in the measuring state of the MAS rotor and opens it in the loading state via a movement that is transverse with respect to the longitudinal axis.
Figure 7B:
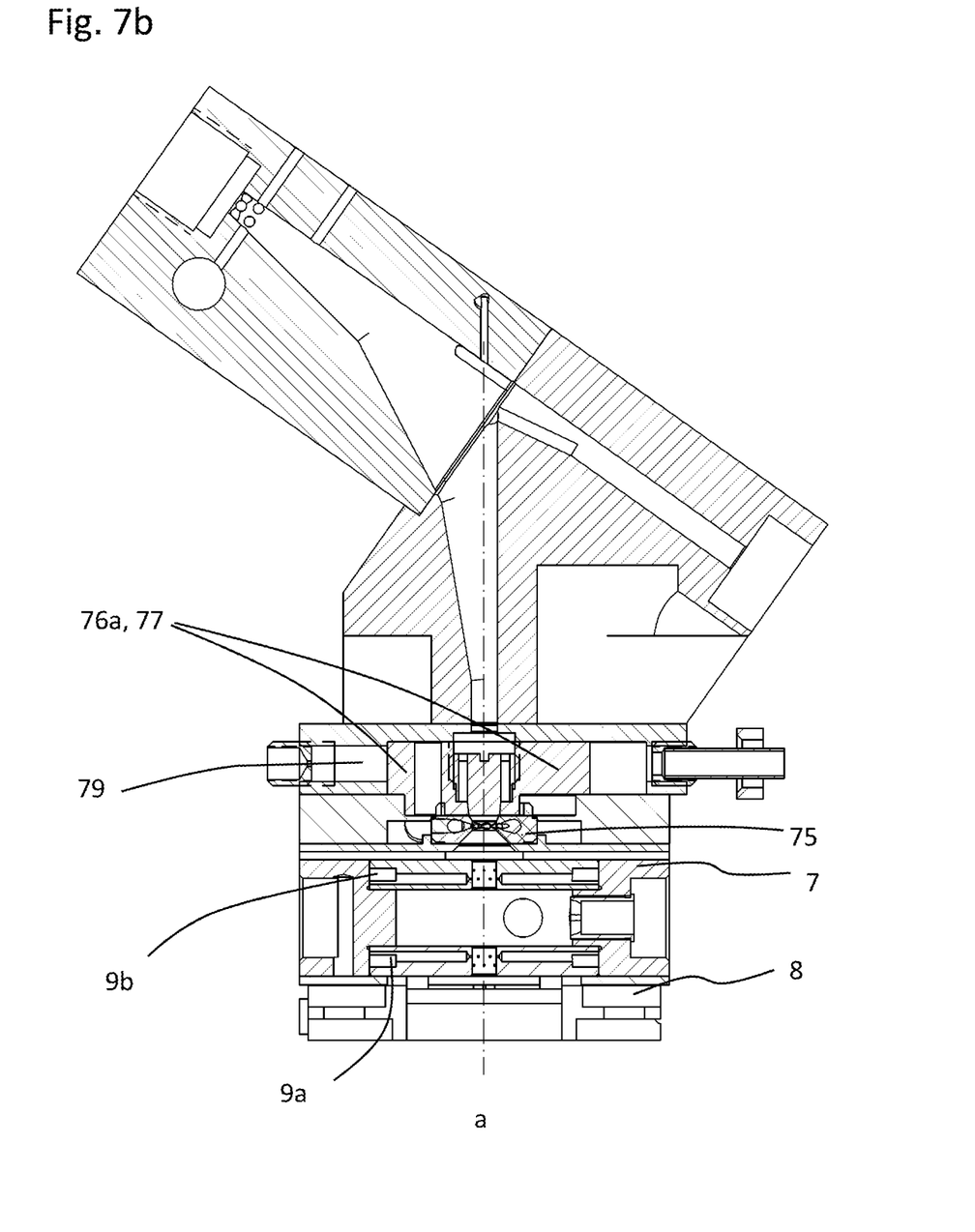
FIG. 7b the sectional view of FIG. 7a, but in the spinning position.

The schematic detail sections of FIGS. 7a and 7b, show an embodiment of the inventive NMR MAS probe head, in which the closing device 76a comprises a gate valve 77, which, in the measuring state of the MAS rotor 21a-21c, closes the opening 76b toward the transport tube 10 and, in the loading state, opens it by a movement that is transverse with respect to the longitudinal axis.

Specifically, FIG. 7a shows the gate valve 77 in its eject or loading position, while FIG. 7b shows the corresponding spinning position, in which the NMR MAS measurement is performed. In this spinning position as shown in FIG. 7b, the gate valve 77 is moved to the left, usually by application of pressure from the right-hand side, which is executed by means of a pressure element 79 (shown only very schematically in the drawing) and usually loaded with spring force so that, instead of the opening 76b, the front bearing 75 is positioned on the longitudinal axis a as an extension of the transport tube 10 and therefore closes the space inside the MAS stator 7 between the base bearing 8 and the front bearing 75 toward the transport tube 10 in the measuring state. The outlet air cross-section of the pressure element 79 for controlling the actuator can be set with a set screw (also not shown in detail).

Figure 8A:
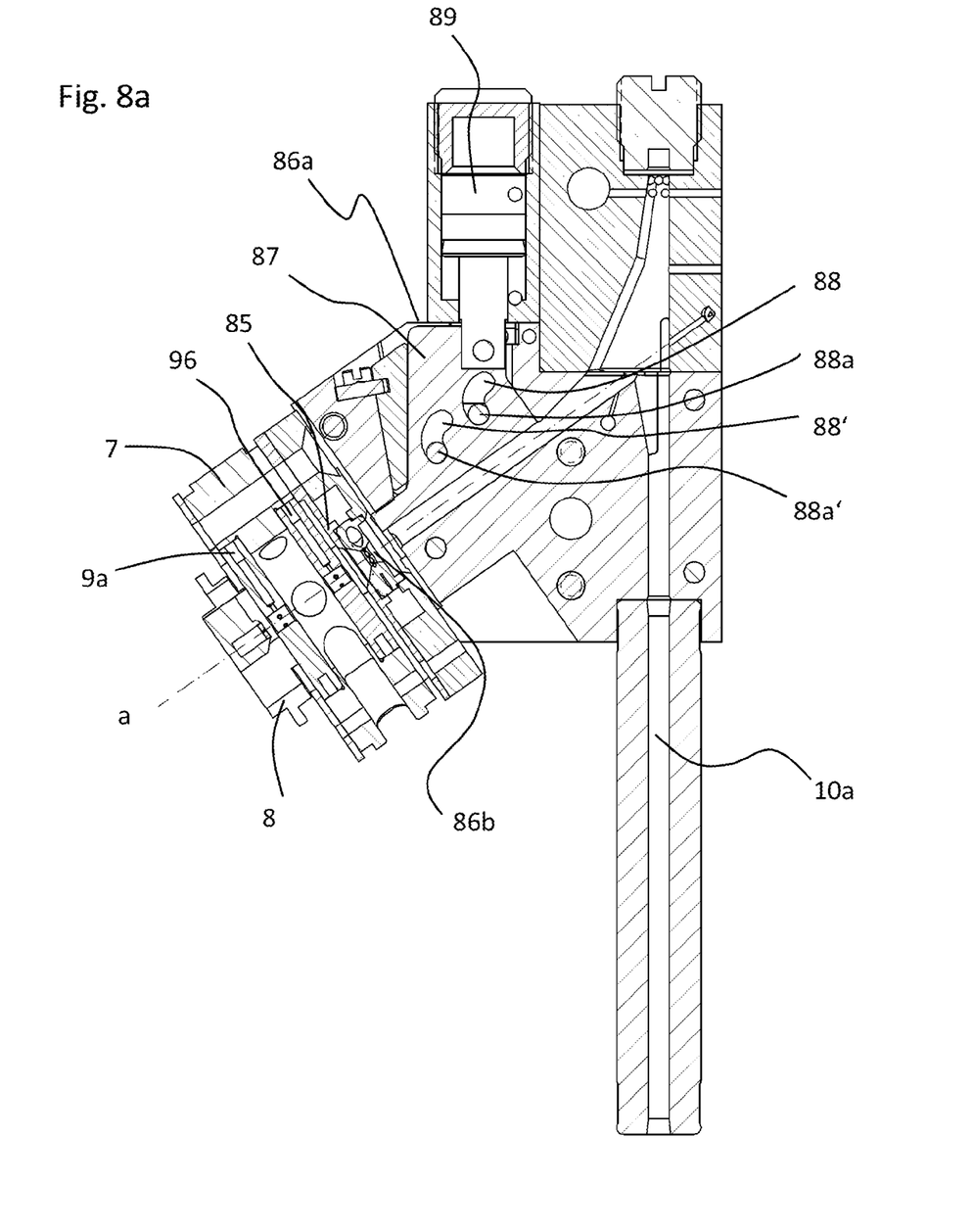
FIG. 8a a detail section, in the ejection position, of an alternative embodiment of the inventive probe head in which the gate valve in the loading state of the MAS rotor frees the opening to the transport tube via a movement on a kidney-shaped guide curve having one component that is transverse and one component that is parallel to the longitudinal axis.
Figure 8B:
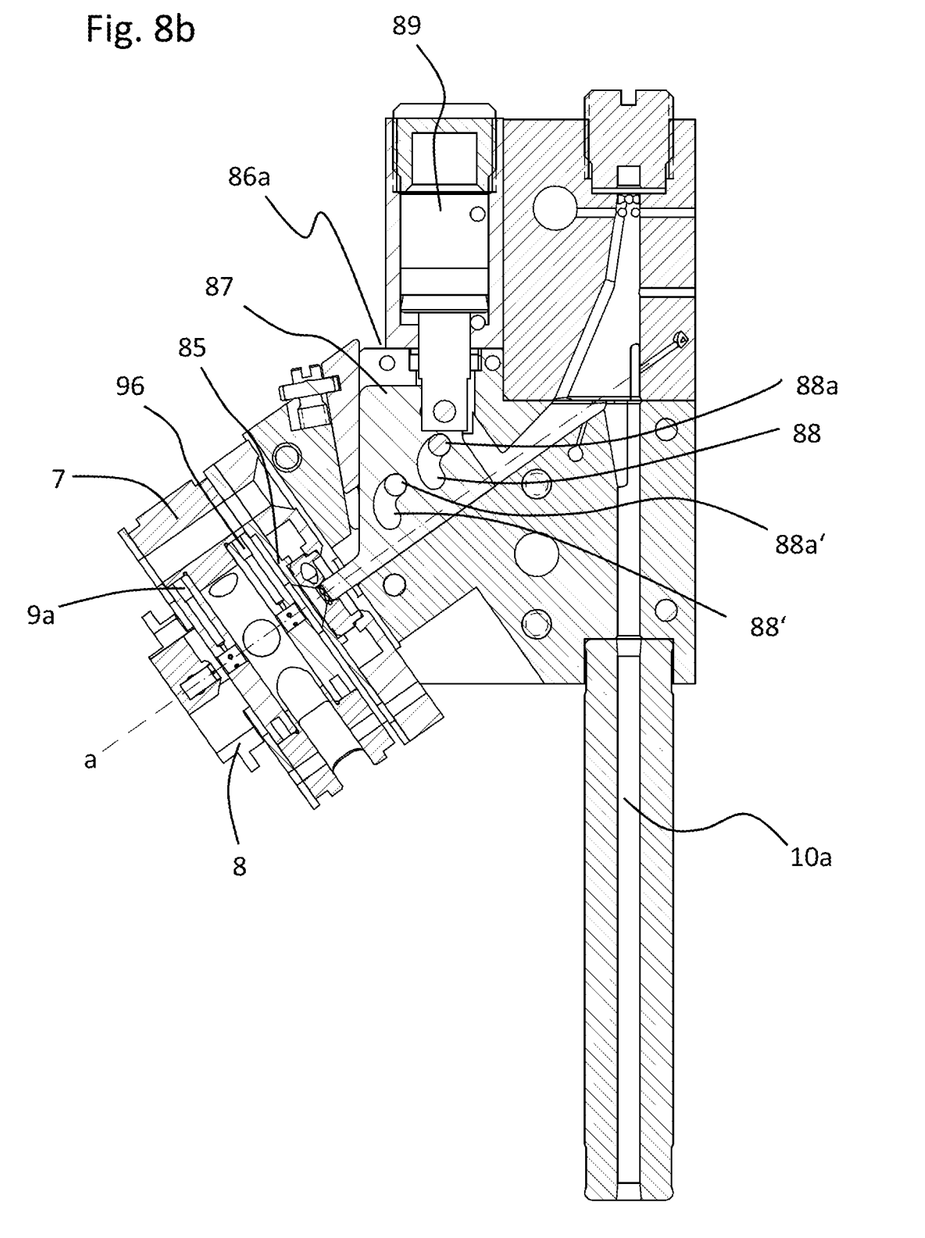
FIG. 8b the sectional view of FIG. 8a, but in the spinning position.

FIGS. 8a and 8b show an alternative embodiment of the inventive NMR MAS probe head in which the closing device 86a, in turn, comprises a gate valve 87, which, in the measuring state of the MAS rotor 21a-21c, closes the opening 86b toward the transport tube 10, but opens it in the loading state, not by a linear movement that is transverse with respect to the longitudinal axis a, but by a movement along a kidney-shaped curve having one component that is transverse and one component that is parallel to the longitudinal axis a. For this purpose, the gate valve 87 is guided on the curved trajectory by means of guide contours 88, 88' on guide pins 88a, 88a'.

Specifically, FIG. 8a shows the gate valve 87 in its eject or loading position, in which the rotor channel is free. In this position (shown very schematically in the drawing), compressed gas is applied to the pneumatic cylinder of a spring-loaded pressure element 89. By comparison, FIG. 8b shows the corresponding spinning position, in which the NMR MAS measurement is performed. In this spinning position, the pneumatic cylinder is not under pressure. The gate valve 87 is pressed by the application of spring force from the bottom right to the top left so that, instead of the opening 86b, the front bearing 85 is positioned on the longitudinal axis a as an extension of the transport tube 10 and the space inside the MAS stator 7 between the base bearing 8 and the front bearing 85 closes toward the transport tube 10 in the measuring state.

Here too, the outlet air cross-section of the pressure element 89 for controlling the actuator can be set with a set screw (also not shown in detail).

The pressure elements 79; 89 are usually loaded by a compression spring made of non-magnetic material, preferably CuBe or spring bronze.

Figure 9:
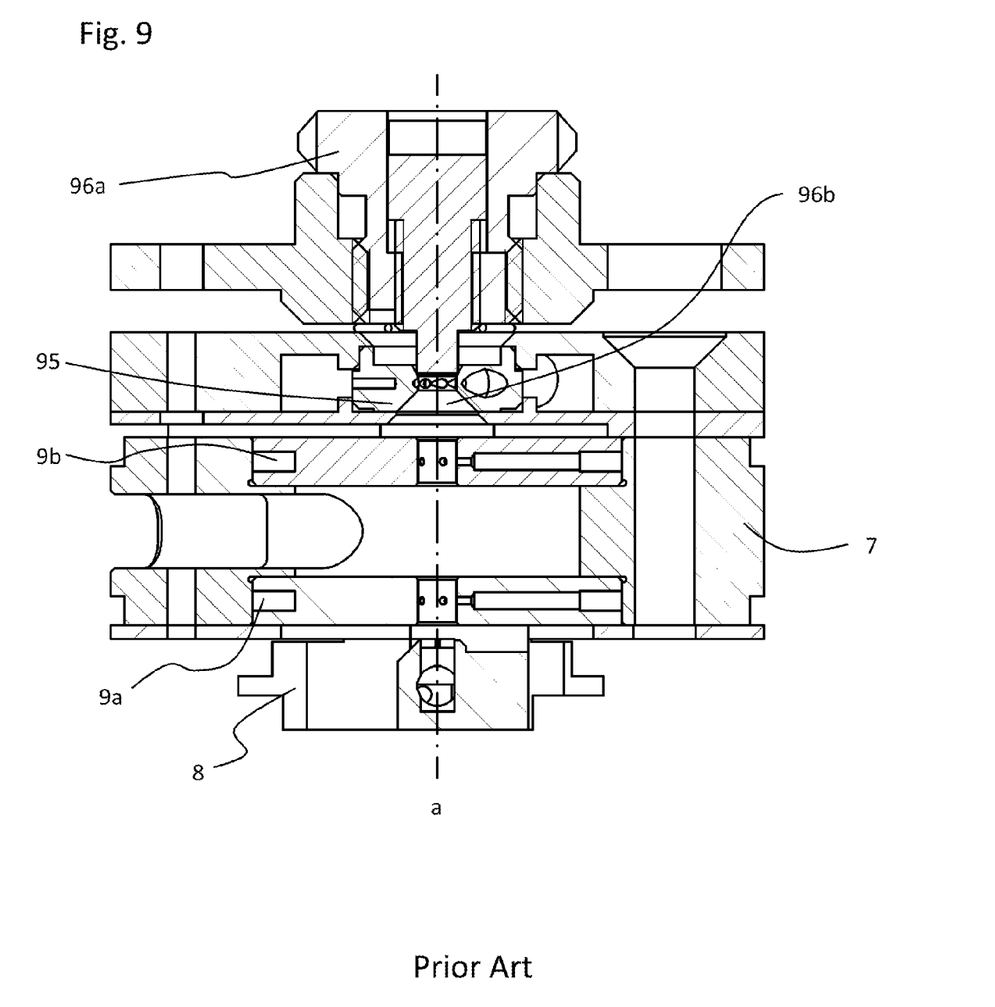
FIG. 9 a schematic sectional view of a probe head according to prior art with the characteristics defined in the introduction and with a front bearing that can be screwed on and off by hand for inserting or removing the rotor.

FIG. 9 shows a schematic detailed section of a generic probe head according to prior art, which has the characteristics defined in the introduction and comprises a front bearing 95 that can be screwed on and off by hand for inserting or removing the rotor in the space inside the MAS stator 7 between base bearing 8 and front bearing 95. When the front bearing 95 is screwed on, the opening 96b of the closing device 96a is always closed so that automated loading and unloading with the rotor is not possible. This must always be inserted and removed by hand.

We claim:

1. A nuclear magnetic resonance (NMR) magic-angle spinning (MAS) probe head for measuring a substance at a measuring position, the probe head comprising:
   a tube;
   an elongated, substantially circularly cylindrical MAS rotor, said MAS rotor structured for receiving the substance to be measured;
   an MAS stator disposed in said tube, wherein said MAS stator has a base bearing and a front bearing having an opening, said MAS stator being disposed, structured and dimensioned for receiving said MAS rotor following insertion thereof from an upward direction into said MAS stator through said opening and into a space between said base bearing and said front bearing, wherein said MAS stator has an axis passing through a center of said base bearing and a center of said opening;
   a transport tube for conveying said MAS rotor inside said transport tube, said transport tube extending in an interior of said tube to said MAS stator; and
   a gate valve, wherein, in a loading state, said gate valve opens said opening in said MAS stator and, in a measuring state, said gate valve completely closes said opening in said MAS stator, said gate valve thereby being disposed, structured and dimensioned to pass between said loading state and said measuring state by means of a movement that is transverse with respect to said axis of said MAS stator, wherein said gate valve is disposed above said space in which the substance to be measured is located at the measuring position.

2. The probe head of claim 1, wherein said gate valve has a pneumatic actuator structured to open said opening in said loading state.

3. The probe head of claim 2, further comprising a pneumatic sample changing system for feeding and removing said MAS rotor to and from said MAS stator.

4. The probe head of claim 3, wherein said transport tube has a Y-junction device with a blind hole section for intermediate storage of said MAS rotor.

5. The probe head of claim 4, wherein said blind hole section is constituted in a rocker and said rocker is structured to swivel about a pivot.

6. The probe head of claim 3, wherein said pneumatic actuator of said closing device is operated with a same compressed air supply as said pneumatic sample changing system.

7. The probe head of claim 1, wherein the probe head is constituted as a Dewar vessel in a region of said tube.

8. The probe head of claim 1, wherein said MAS stator is rotatably supported for setting an MAS angle.

9. The probe head of claim 1, wherein, in said measuring state of said MAS rotor, said gate valve closes said opening with respect to said transport tube and, in said loading state, releases said opening via a movement along a curved trajectory having one component that is transverse and one component that is parallel to said longitudinal axis.

10. The probe head of claim 9, wherein said gate valve is guided along said curved trajectory on one or more guide pins by means of a guide contour.

11. The probe head of claim 1, wherein said gate valve contains a pressure element loaded with spring force, which, in said measuring state of the MAS rotor, effects closure of said opening.

12. The probe head of claim 11, wherein said pressure element is loaded by a compression spring made of non-magnetic material, of CuBe or of spring bronze.

* * * * *